United States Patent
Xu et al.

(10) Patent No.: US 10,573,400 B2
(45) Date of Patent: Feb. 25, 2020

(54) SHIFT REGISTER, GATE DRIVING CIRCUIT, ARRAY SUBSTRATE, AND DISPLAY APPARATUS

(71) Applicants: BOE TECHNOLOGY GROUP CO., LTD., Beijing (CN); BEIJING BOE OPTOELECTRONICS TECHNOLOGY CO., LTD., Beijing (CN)

(72) Inventors: Shuai Xu, Beijing (CN); Hong Zhu, Beijing (CN); Hongjun Yu, Beijing (CN)

(73) Assignees: BOE TECHNOLOGY GROUP CO., LTD., Beijing (CN); BEIJING BOE OPTOELECTRONICS TECHNOLOGY CO., LTD., Beijing (CN)

(*) Notice: Subject to any disclaimer, the term of this patent is extended or adjusted under 35 U.S.C. 154(b) by 298 days.

(21) Appl. No.: 15/757,734

(22) PCT Filed: Aug. 14, 2015

(86) PCT No.: PCT/CN2015/087008
§ 371 (c)(1),
(2) Date: Mar. 6, 2018

(87) PCT Pub. No.: WO2016/095544
PCT Pub. Date: Jun. 23, 2016

(65) Prior Publication Data
US 2019/0051364 A1    Feb. 14, 2019

(30) Foreign Application Priority Data

Dec. 15, 2014 (CN) .......................... 2014 1 0778895

(51) Int. Cl.
*G11C 19/28* (2006.01)
*G09G 3/36* (2006.01)
*G09G 3/20* (2006.01)

(52) U.S. Cl.
CPC .............. *G11C 19/28* (2013.01); *G09G 3/20* (2013.01); *G09G 3/3674* (2013.01);
(Continued)

(58) Field of Classification Search
None
See application file for complete search history.

(56) References Cited

U.S. PATENT DOCUMENTS

| 6,181,312 | B1 | 1/2001 | Sekine |
| 2010/0109996 | A1 | 5/2010 | Park et al. |
| 2015/0279272 | A1* | 10/2015 | Takahara ............. G09G 3/3233 345/76 |

FOREIGN PATENT DOCUMENTS

| CN | 103165056 A | 6/2013 |
| CN | 103970389 A | 8/2014 |

(Continued)

OTHER PUBLICATIONS

International Search Report dated Aug. 14, 2015, issued in counterpart International Application No. PCT/CN2015/087008 (13 pages).

*Primary Examiner* — Benjamin C Lee
*Assistant Examiner* — Emily J Frank
(74) *Attorney, Agent, or Firm* — Westerman, Hattori, Daniels & Adrian, LLP

(57) ABSTRACT

A shift register includes a plurality of shift register units (10), a detecting unit (20), and a reset unit (30). The detecting unit (20) is connected to at least two of the plurality of shift register units (10) to detect output potentials of the two shift register units (10) and to send a detection result to the reset unit (30). The reset unit (30) is connected to at least one of the two shift register units (10)

(Continued)

such that, upon detection of output potential of each of the at least two shift register units (10) connected to the detecting unit (20) over a predetermined value, the reset unit (30) resets output potentials of at least one of the two of shift register units (10) connected to the reset unit (30) based on a detection result.

14 Claims, 2 Drawing Sheets

(52) U.S. Cl.
CPC ............... *G09G 2300/0408* (2013.01); *G09G 2310/0213* (2013.01); *G09G 2310/0267* (2013.01); *G09G 2310/0286* (2013.01); *G09G 2310/063* (2013.01)

(56) References Cited

FOREIGN PATENT DOCUMENTS

| | | |
|---|---|---|
| CN | 104392705 A | 3/2015 |
| CN | 204257182 U | 4/2015 |

\* cited by examiner

SHIFT REGISTER, GATE DRIVING CIRCUIT, ARRAY SUBSTRATE, AND DISPLAY APPARATUS

CROSS-REFERENCES TO RELATED APPLICATIONS

This PCT patent application claims priority of Chinese Patent Application No. 201410778895.1, filed on Dec. 15, 2014, the entire content of which is incorporated by reference herein.

FIELD OF THE INVENTION

The present invention generally relates to the display technologies and, more particularly, to a shift register, a gate driving circuit, an array substrate, and a display apparatus containing the same.

BACKGROUND

The working principle of displaying one frame of image or data by using TFT-LCD (Thin Film Transistor-Liquid Crystal Display) is using a gate driving circuit to input a square wave signal into each row of pixels from the top row to the bottom row to select and enable rows of pixels. The square wave signal has a certain pulse-width. A source driving circuit may generate the output signal required for each row of pixels sequentially from the top row to the bottom row.

Currently, in many TFT-LCDs, the gate driving circuit and the source driving circuit are installed outside the display panel. This configuration can cause undesirably high cost. Thus, other alternative ways have been considered to lower the cost. For example, a gate driving circuit with a plurality of shift register units, i.e., GOA (Gate Drive On Array) circuit, has been designed and manufactured on the display substrate.

In the GOA circuit, the output timing includes an effective display period and a blank period. As shown in FIG. 3, specifically, when the display panel is displaying one frame, the outputs are in the effective display period. The shift register units. i.e., from the first shift register unit ($G_1$) to the $N_{th}$ shift register unit ($G_N$), can scan the gate line connected to each shift register unit and output the scan signals. After each gate line is scanned, the circuit goes to the blank period. In the blank region, since none of the shift register units functions, the output potential of each shift register unit becomes 0 at the same time (because the output potential of a shift register unit is negative, the output changing to 0 V is a pull-up process). The pull-up process in the bank period causes the output of each shift register unit to be unstable.

BRIEF SUMMARY OF THE DISCLOSURE

The present invention partially addresses the above problems in the prior art, there is provided a shift register, a gate driving circuit, an array substrate, and a display apparatus. The shift register generates stable outputs.

One aspect of the present disclosure provides a shift register. The shift register includes a plurality of shift register units, a detecting unit, and a reset unit. The detecting unit is connected to at least two of the plurality of shift register units to detect output potentials of the two shift register units and to send a detection result to the reset unit. The reset unit is connected to at least one of the two shift register units such that, upon detection of output potential of each of the at least two shift register units connected to the detecting unit over a predetermined value, the reset unit resets output potentials of at least one of the two of shift register units connected to the reset unit based on a detection result.

Optionally, the predetermined potential value is a threshold value allowed to be outputted by a shift register unit in a blank period; and the reset unit is connected to each of the plurality of shift register units such that when the detecting unit detects output potential of each of the plurality of shift register units connected to the detecting unit is over the predetermined potential value, the reset unit resets output potential of each of the plurality of shift register unit connected to the reset unit.

Optionally, the detecting unit includes a conversion module that is electrically connected to at least two shift register units and the reset unit, the conversion module converting output potentials of the at least two shift register units to a first potential and controlling operations of the reset unit through the first potential.

Optionally, the detecting unit further includes a bidirectional logic level adjustment module having a plurality of forward transmitting channels and at least one reverse transmitting channel; each of the at least two shift register units are connected to the conversion module through a different forward transmitting channel; the bidirectional logic level adjustment module is connected to at least two shift register units such that the bidirectional logic level adjustment module adjusts output potentials of the at least two shift register units to first intermediate potentials and sends the first intermediate potentials to the conversion module; the conversion module is connected to the bidirectional logic level adjustment module through the reverse transmitting channel to convert the first intermediate potentials to a second intermediate potential; and the reverse transmitting channel adjusts a value of the second intermediate potential to a value of the first potential and sends the value of the first potential to the reset unit.

Optionally, the conversion module is an AND gate.

Optionally, the reset unit includes at least one switch transistor such that a gate of each switch transistor is connected to the reverse transmitting channel, a source of each switch transistor is connected to a shift register unit, and a drain of each switch transistor is connected to a reset signal; and each shift register unit is connected to the source of a corresponding switch transistor.

Optionally, the bidirectional logic level adjustment module includes two forward transmitting channels and one reverse transmitting channel; and one of the two forward transmitting channels is connected to a first shift register unit of the plurality of cascading shift register units, and one of the two forward transmitting channels is connected to a last shift register unit of the plurality of cascading shift register units.

Optionally, the reset unit includes a plurality of switch transistors corresponding to shift register units based on a one-to-one mapping; and gates of the plurality of switch transistors are connected to the reverse transmitting channel, sources of the plurality of switch transistors are connected to the shift register units, and drains of the plurality of switch transistors are connected to the reset signal.

Optionally, the switch transistors are N-type transistors.

Optionally, the first potential is high and the reset signal is low.

Optionally, the detecting unit is connected to two of the shift register units.

Optionally, one of the two shift register units is a first shift register unit of the plurality of shift register units; and the other of the two of the shift register units is a last shift register unit of the plurality of shift register units.

Another aspect of the present disclosure provides a gate driving circuit. The gate driving circuit includes the disclosed shift register.

Another aspect of the present disclosure provides an array substrate. The array substrate includes a gate driving circuit that incorporates the disclosed shift register.

Another aspect of the present disclosure provides a display apparatus. The display apparatus includes the array substrate with a gate driving circuit that incorporates the disclosed shift register.

Other aspects of the present disclosure can be understood by those skilled in the art in light of the description, the claims, and the drawings of the present disclosure.

BRIEF DESCRIPTION OF THE DRAWINGS

The following drawings are merely examples for illustrative purposes according to various disclosed embodiments and are not intended to limit the scope of the present disclosure.

DETAILED DESCRIPTION

For those skilled in the art to better understand the technical solution of the invention, reference will now be made in detail to exemplary embodiments of the invention, which are illustrated in the accompanying drawings. Wherever possible, the same reference numbers will be used throughout the drawings to refer to the same or like parts.

One aspect of the present disclosure provides a shift register.

Figure 1:
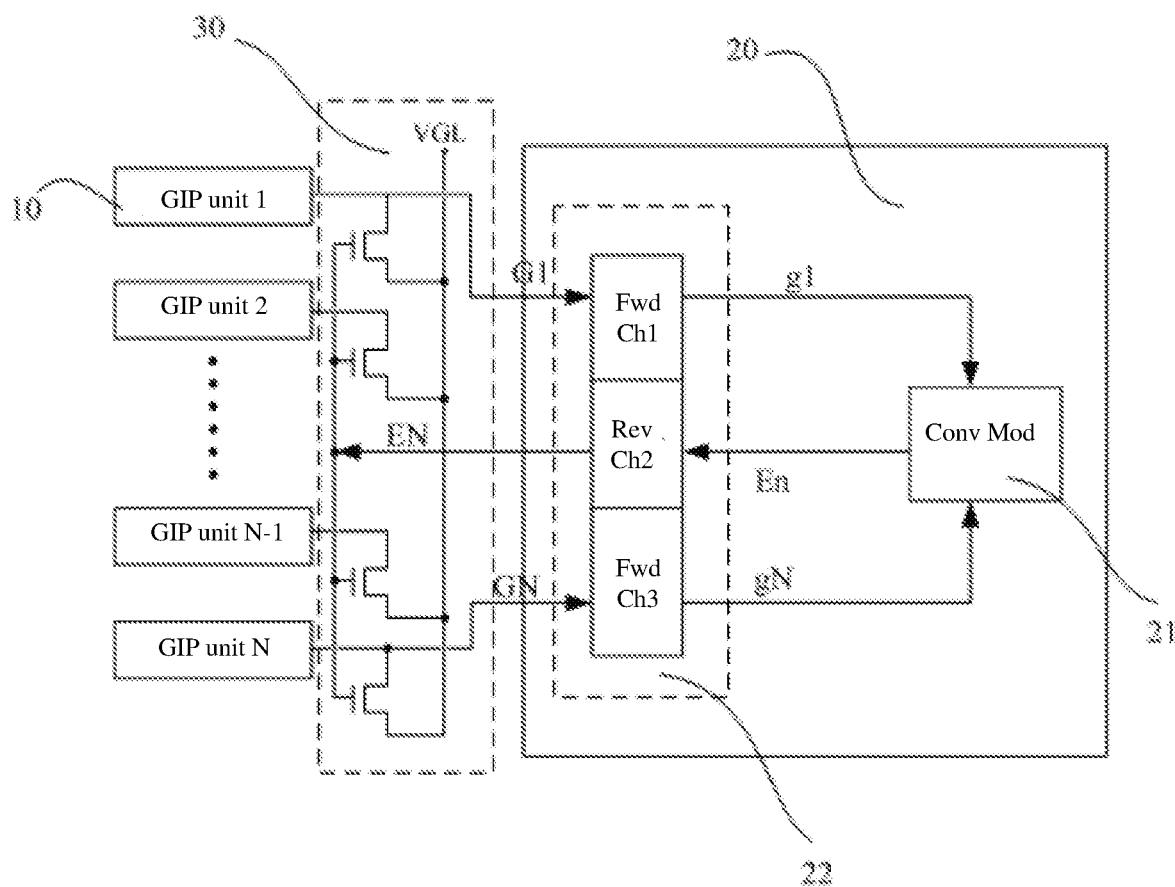
FIG. 1 illustrates the structure of an exemplary shift register in embodiment 1 according to the disclosed embodiments.

As shown in FIG. 1, the present disclosure provides a shift register. The shift register may include a plurality of cascading shift register units 10, a detecting unit 20, and a reset unit 30. A shift register unit 10 can be a gate in plane (GIP) unit. In the shift register, the detecting unit 20 may be connected to at least two shift register units 10 to detect the output potentials, e.g., $G_1$ and $G_N$, of the shift register units 10. The detecting unit 20 may send the result of detection to the rest-feedback unit 30. The reset unit 30 may be connected to at least one shift register units 10. When the detecting unit 20 detects the output potentials of the shift register units 10 connected to the detecting unit 20, e.g., $G_1$ and $G_N$, are both equal to or are over a predetermined potential value $V_{th}$, the reset unit 30 may reset the output potentials of the shift registers connected to the reset unit 30, e.g., $G_1$ to $G_N$. The predetermined potential value $V_{th}$ is the threshold output potential allowed by each shift register unit 10 in the blank period.

It is understood by those skilled in the art that, when displaying a frame, the displaying timing may include an effective display period and a blank period. In the display timing diagram, the effective display period may refer to the time period for each shift register unit 10 to sequentially output a square wave signal and send the square wave signal to the gate line connected to the shift register unit 10. The blank period may refer to the time period during which none of the shift register units 10 functions after each of the shift register unit 10 has outputted the square wave signal. Simply put, for example, when the display apparatus is displaying images, the transition period between showing one image to the next image may be the blank period, and the time period for scanning the image of one frame may be the effective display period.

It should be noted that, in the instance of the transition from the effective display period to the blank period and the instance of the transition from the blank period to the effective display period, the output potential of each shift register unit 10 may not be able to change instantaneously, e.g., each output potential may need a certain time period to change. Specifically, after each shift register unit 10 outputs a square wave signal in the effective display period, the output potential of each shift register unit 10 may change from VGH to VGL. When the displaying timing is in the blank period, each shift register unit 10 may continue to output VGL and then change from VGL to 0 V. The process of the output potentials changing from VGL to 0 V may represent the pull-up process. Similarly, in the transition from the blank period to the effective display period, the output potential of each shift register unit 10 may also change from VGL to 0 V before changing from VGL to VGH. It is understood by those skilled in the art that output potentials to be compared with the predetermined potential value may often be the output potentials after the potential values have changed in the blank period. That is, the output potentials in the blank period may often refer to the output potentials after they started changing from VGL.

In embodiment 1, the shift register may further include a detecting unit 20. When the detecting unit 20 detects the output potential of each shift register unit 10 connected to the detecting unit 20 to be $V_{th}$, the timing for displaying the frame may be in the blank period. In the blank period, none of the shift register unit 10 functions, the output potentials of the shift register units 10, i.e., $G_1$ to $G_N$, may not maintain the output potentials of the last period such that output potentials of the shift register units 10 may not be stable. The unstable output potentials further may cause the displayed image to be unstable. However, in embodiment 1, the shift register provided may further include a reset unit 30. When the detecting unit 20 detects the output potential of each shift register unit 10 connected to the detecting unit 20 to be $V_{th}$, the detecting unit 20 may reset the output potentials connected to the reset unit 30 (i.e., $G_1$ to $G_N$) such that at least a number of the shift register units 10 may have stable output potentials $G_i$.

In some embodiments, the reset unit 30 may be connected to each shift register unit 10. When the detecting unit 20 detects the output potentials of the shift register units 10 connected to the detecting unit 20 to be the predetermined value, the reset unit 30 may reset the output potential of each shift register unit 10. Thus, when the detecting unit 20 detects the output potentials of the shift register units 10 connected to the detecting unit 20 to be $V_{th}$, the reset unit 30 may reset the output potential of each shift register unit 10, i.e., $G_1$ to $G_N$, based on the detection result such that the output potential of each shift register 10 can be stable. The stable output potentials can ensure the output of the entire shift register to be stable.

In one embodiment of the present disclosure, the detecting unit 20 may include a conversion module 21 (shown as Conv Mod in FIG. 1). The conversion module 21 may be electrically connected to at least two shift register units 10 and the reset unit 30 to convert the output potentials of the shift register units 10 connected to the conversion module 21 to a first potential $E_N$. The conversion module 21 may control the functioning of the reset unit 30 through the first potential $E_N$.

Figure 2:
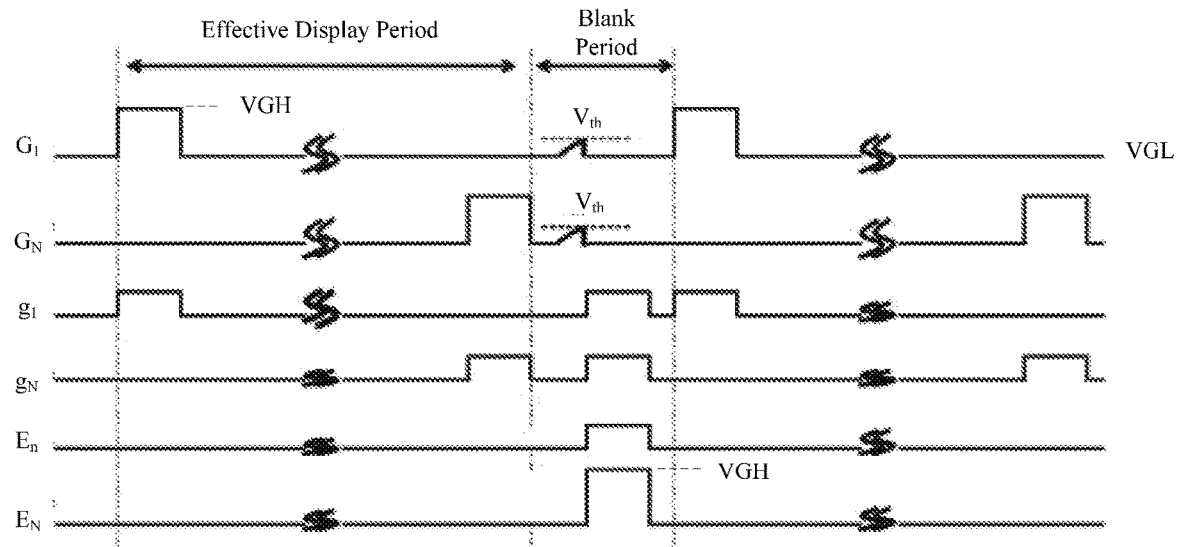
FIG. 2 illustrates an exemplary timing diagram of the shift register disclosed in FIG. 1 according to the disclosed embodiments.

Specifically, the embodiment can be explained in light of the two shift register units 10 connected to the detecting unit 20. Since the timing for displaying a frame is in the effective display period, each shift register units 10 may first output a square wave signal and then output a low signal. The shift register units 10 may output the described signals in a sequential manner, e.g., from the top/first shift register unit (GIP unit 1) to the bottom/last shift register (GIP unit N), as shown in FIGS. 1 and 2. In the blank period, none of the shift register units 10 functions, and the output potential of each shift register unit 10 may be gradually pulled up until the output potential reaches 0 V. The shift register units 10 may be in a floating state. Thus, when one of the shift register units 10 outputs a square wave signal, it can be determined that the timing for displaying the image is in the effective display period and the other shift register unit 10 must output a low signal. The conversion module 21 may receive the output potentials of the two shift register units 10, i.e., $G_1$ and $G_N$, and convert the received output potentials to the first potential $E_N$. The first potential $E_N$ may be low. The first potential $E_N$ may control the reset unit 30 such that the reset unit 30 does not function at this time.

When the output potential of one of the shift register units 10, i.e., one of $G_1$ or $G_N$, is a low signal (e.g., VGL), it can be determined that the timing for displaying the image is also in the effective display period. The output potential of the other shift register unit 10, e.g., $G_1$ or $G_N$, may be a low signal or a square wave signal. The conversion module 21 may receive the output potentials of the two shift register units 10, e.g., $G_1$ and $G_N$, and convert the received output potentials to the first potential $E_N$. The first potential $E_N$ may be a logic low.

Figure 3:
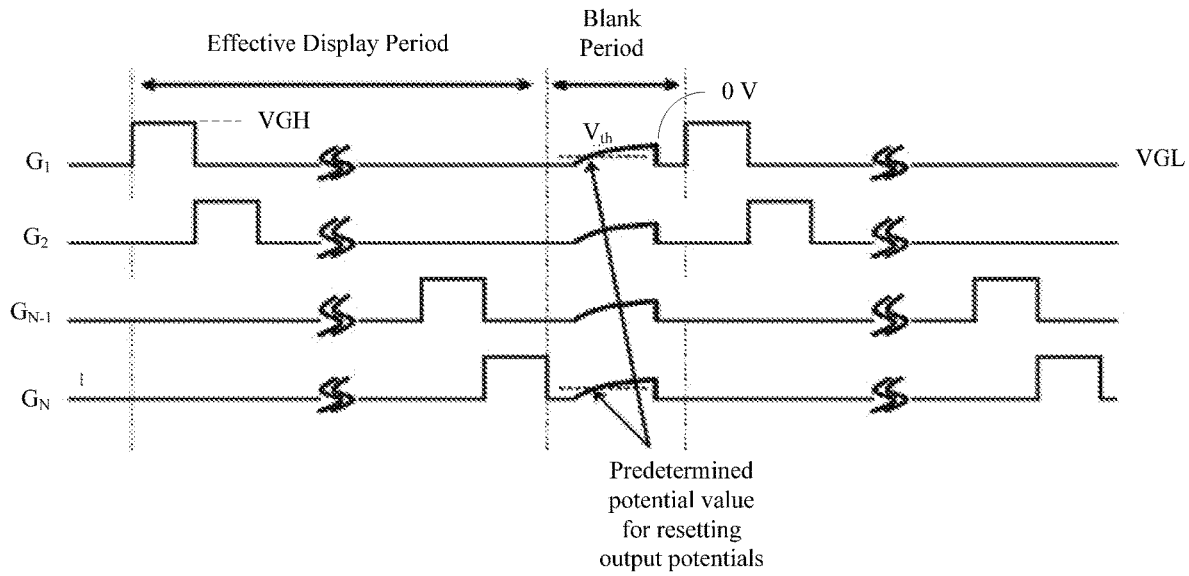
FIG. 3 illustrates a timing diagram of a conventional shift register.

When the output potentials of the two shift register units 10, i.e., $G_1$ and $G_N$, are both detected to be the predetermined potential value $V_{th}$, it can be determined that the timing for displaying the image is in the blank period and the output potentials of other shift register units 10 must also be the predetermined potential value $V_{th}$. Since $V_{th}$ is an increased value compared to the low signal values of $G_1$ and $G_N$ in the effective display period, the predetermined potential value $V_{th}$ can be defined as a high signal. For example, $V_{th}$ may be −2 V in one embodiment. At this time, the conversion module 21 may receive the output potentials of the two shift register units 10, i.e., $G_1$ and $G_N$, and convert the received output potentials to the first potential $E_N$, where $E_N$ may be a logic high. The logic high $E_N$ can control the function of the reset unit 30 and reset the output potential of each shift register unit 10, i.e., $G_1$ to $G_N$. That is, the logic high $E_N$ can control the reset unit 30 to pull down the output potential of each shift register unit 10 such that the output of the shift register can be more stable. FIG. 2 illustrates a timing diagram of the present disclosure and FIG. 3 illustrates a timing diagram of a conventional shift register. By comparing FIGS. 2 and 3, it is obvious that in the blank period, outputs of a conventional shift register (FIG. 3) may undergo dramatic changes. However, in FIG. 2, it can be seen that the outputs in the blank period are greatly improved.

Since an AND gate can output a logic high signal when the two inputs are high signals and can output a logic low signal when at least one of the two inputs is a low signal, the conversion module 21 may be an AND gate (not shown).

It should be noted that, in one embodiment, the detecting unit 20 may also be connected to more than two shift register units 10. For simple wiring purposes, the detecting unit 20 may be optionally connected to two shift register units 10. Further, the two shift register units 20 connected to the detecting unit 20 may be the first shift register and the last shift register of a plurality of cascading shift register units 10. This type of connection or configuration ensures that each shift register unit 10 can complete its function for displaying the frame in the effective display period, and that the resetting of the output potentials in the blank period is more accurate.

In another embodiment of the present disclosure, different from the above embodiment 1, the detecting unit 20 may include not only the conversion module 21, but also a bidirectional logic level adjustment module 22. The bidirectional logic level adjustment module 22 may include a plurality of forward transmitting channel and at least one reverse transmitting channel. The shift register units 10 connected to the bidirectional logic level adjustment module 22 may each be connected to the conversion module 21 through a different forward transmitting channel. The bidirectional logic level adjustment module 22 may adjust the output potentials of the shift register units 10 connected to the bidirectional logic level adjustment module 22, i.e., $G_1$ and $G_N$, to first intermediate potentials $g_1$ and $g_N$. The bidirectional logic level adjustment module 22 may further send the first intermediate potentials $g_1$ and $g_N$ to the conversion module 21. The conversion module 21 may also be connected to the bidirectional logic level adjustment module 22 through a reverse transmitting channel to adjust the first intermediate potentials $g_1$ and $g_N$ to a second intermediate potentials $E_n$. The reverse transmitting channel may adjust the second intermediate potential $E_n$ to the first potential $E_N$ and output $E_N$ to the reset unit 30.

In some embodiments, the reset unit 30 may include a plurality of switch transistors. The reset unit 30 may also be referred as a TFT (thin-film transistor) unit. A switch transistor may refer to a transistor functioning as a switch. Each shift register unit 10 may correspond to one switch transistor. The gate of each switch transistor may be connected or joined together to be connected to the reverse transmitting channel. The source of each switch transistor may be connected to one shift register unit 10. The drain of each switch transistor may be connected or joined together to be connected to the low potential VGL. The configuration above takes advantage of the simple structure and the relative easy control of the switch transistors.

Further, in some embodiments, each switch transistor may be a N-type transistor. When the conversion module 21 or the AND gate detects the output potential of each shift register 10 connected to the conversion module 21 to be the predetermined potential value $V_{th}$, the conversion module 21 (or the AND gate) may output a logic high signal, i.e., VGH, such that each switch transistor can be turned on. VGH may be the turn-on potential of the TFT unit. Meanwhile, since the drain of each switch transistor are connected together to be connected to the low potential or reset signal VGL, the low potential VGL can pull down the output potential of each shift register unit 10. The output of the shift register can thus be more stable.

It may be preferred that only a portion of the shift register units 10 are connected to switch transistors. For example, the reset unit 30 may only include two switch transistors. That is, only two of the plurality of shift transistor units 10 are connected to the source of the corresponding switch transistor. The drains of the two switch transistors may both be connected to the reset signal, i.e., VGL. The gates of the two switch transistors may both be connected to the reverse transmitting channel. It should be noted that the reset unit 30 may only reset the output potentials of the two shift register units 10.

Similarly, the present disclosure may be further illustrated in light of the two shift registers 10 connected to the detecting unit 20. It should be noted that the bidirectional logic level adjustment module 22 in the above embodiment can be a three-channel bidirectional logic level adjustment module 22. That is, the three-channel bidirectional logic level adjustment module 22 may include two forward transmitting channels and one reverse transmitting channel. Referring to FIG. 1, Fwd Ch1 and Fwd Ch3 may represent the two forward transmitting channels. Rev Ch2 may represent the one reverse transmitting channel.

Specifically, one shift register unit 10 may send the output potential $G_1$ to the first forward transmitting channel (i.e., Fwd Ch1) and the other shift register unit 10 may send the output potential $G_N$ to the second forward transmitting channel (i.e., Fwd Ch3). The two forward transmitting channels, Fwd Ch1 and Fwd Ch3, may each adjust the received output potential and output two first intermediate potentials $g_1$ and $g_N$. The conversion module 21 or the AND gate may convert the two first intermediate potentials $g_1$ and $g_N$ to the second intermediate potential $E_n$. The conversion module 21 or the AND gate may send the second intermediate potential $E_n$ to the reverse transmitting channel (i.e., Rev Ch2) for further adjustment. The reverse transmitting channel Rev Ch2 may output the first potential $E_N$ after the adjustment to control the function of the reset unit 30.

When the two output first intermediate potentials $g_1$ and $g_N$ are both high, the second intermediate potential $E_n$ converted by the conversion module 21 may also be high. The first potential $E_N$ after the adjustment by the reverse transmitting channel may be high such that each switch transistor is turned on and the reset signal can reset the output of each shift register unit 10. Since the reset signal is the low potential VGL, the output potential of each shift register 10 can be reset to be the low potential VGL.

In the above configuration, when the input potentials to both of the forward transmitting channels reach the predetermined potential value $V_{th}$, since the predetermined potential value $V_{th}$ may be undesirably low, the forward transmitting channels may amplify each of the input potentials to a high value. That is, the two inputs may be amplified to first intermediate potentials $g_1$ and $g_N$. The conversion module 21 (or the AND gate) may convert the two first intermediate potentials $g_1$ and $g_N$ and output a high signal, i.e., the second intermediate potential $E_n$. The reverse transmitting channel may further adjust (amplify or decrease) the second intermediate potential $E_n$ to obtain a stable high signal, i.e., the first potential $E_N$. Thus, the detecting unit 20 may use the first potential $E_N$ to control the function of the reset unit 30 and reset the output potential of each shift register unit 10. The resetting processing may refer to a pull-down process such that the output of the shift register can be stable.

Similarly, when the output potentials of the two shift register units 10 are not both at the predetermined potential value $V_{th}$, the potential (or signal) can also be converted and transmitted according to the process described above. However, when the output potentials of the two shift register units 10 are not at the predetermined potential value $V_{th}$, the reset unit 30 would not be operational. Details have been discussed above and are not repeated herewith.

In certain embodiments, the detecting unit 20 may also include a detecting module and a conversion module. The detecting module may include the bidirectional logic level adjustment module 22, for example, a three-channel logic level adjustment module. The conversion module may include the conversion module 21 (Conv Mod). The functions and working principles of the detecting module and the conversion module have been discussed in the descriptions above and are thus not repeated herewith.

Accordingly, embodiments of the present disclosure further provide a gate driving circuit. The gate driving circuit includes the shift register disclosed above.

Accordingly, embodiments of the present disclosure further provide an array substrate. The array substrate includes the gate driving circuit or shift register disclosed above.

Accordingly, embodiments of the present disclosure further provide a display apparatus. The display apparatus includes the above array substrate, the gate driving circuit, and/or the shift register. The display apparatus may be a liquid crystal display panel, an electronic paper device, an organic light-emitting diode display panel, a mobile phone, a tablet, a television, a monitor, a laptop, a digital photo frame, a navigation device, and/or any suitable product or component with a display function.

It should be understood that the above embodiments disclosed herein are exemplary only and not limiting the scope of this disclosure. Without departing from the spirit and scope of this invention, other modifications, equivalents, or improvements to the disclosed embodiments are obvious to those skilled in the art and are intended to be encompassed within the scope of the present disclosure.

Without limiting the scope of any claim and/or the specification, examples of industrial applicability and certain advantageous effects of the disclosed embodiments are listed for illustrative purposes. Various alternations, modifications, or equivalents to the technical solutions of the disclosed embodiments can be obvious to those skilled in the art and can be included in this disclosure.

What is claimed is:

1. A shift register, comprising:
   a plurality of shift register units;
   a detecting circuit; and
   a reset circuit, wherein:
   the detecting circuit is connected to at least two of the plurality of shift register units to detect output potentials of the two shift register units and to send a detection result to the reset circuit; and
   the reset circuit is connected to at least one of the two shift register units such that, upon detection of output potential of each of the at least two shift register units connected to the detecting circuit over a predetermined value, the reset circuit resets output potentials of at least one of the two of shift register units connected to the reset circuit based on a detection result,
   wherein the predetermined potential value is a threshold value allowed to be outputted by a shift register unit in a blank period; and the reset circuit is connected to each of the plurality of shift register units such that when the detecting circuit detects output potential of each of the plurality of shift register units connected to the detecting circuit is over the predetermined potential value, the reset circuit resets output potential of each of the plurality of shift register unit connected to the reset circuit,
   wherein the detecting circuit includes a conversion circuit that is electrically connected to at least two shift register units and the reset circuit, the conversion circuit converting output potentials of the at least two shift register units to a first potential and controlling operations of the reset circuit through the first potential, and wherein:

the detecting circuit further includes a bidirectional logic level adjustment circuit having a plurality of forward transmitting channels and at least one reverse transmitting channel;

each of the at least two shift register units are connected to the conversion circuit through a different forward transmitting channel;

the bidirectional logic level adjustment circuit is connected to at least two shift register units such that the bidirectional logic level adjustment circuit adjusts output potentials of the at least two shift register units to first intermediate potentials and sends the first intermediate potentials to the conversion circuit;

the conversion circuit is connected to the bidirectional logic level adjustment circuit through the reverse transmitting channel to convert the first intermediate potentials to a second intermediate potential; and the reverse transmitting channel adjusts a value of the second intermediate potential to a value of the first potential and sends the value of the first potential to the reset circuit.

2. The shift register according to claim 1, wherein the conversion circuit is an AND gate.

3. The shift register according to claim 1, wherein:

the reset circuit includes at least one switch transistor such that a gate of each switch transistor is connected to the reverse transmitting channel, a source of each switch transistor is connected to a shift register unit, and a drain of each switch transistor is connected to a reset signal; and each shift register unit is connected to the source of a corresponding switch transistor.

4. The shift register according to claim 1, wherein:

the bidirectional logic level adjustment circuit includes two forward transmitting channels and one reverse transmitting channel; and one of the two forward transmitting channels is connected to a first shift register unit of the plurality of cascading shift register units, and one of the two forward transmitting channels is connected to a last shift register unit of the plurality of cascading shift register units.

5. The shift register according to claim 4, wherein:

the reset circuit includes a plurality of switch transistors corresponding to shift register units based on a one-to-one mapping; and gates of the plurality of switch transistors are connected to the reverse transmitting channel, sources of the plurality of switch transistors are connected to the shift register units, and drains of the plurality of switch transistors are connected to the reset signal.

6. The shift register according to claim 5, wherein the switch transistors are N-type transistors.

7. The shift register according to claim 5, wherein the first potential is high and the reset signal is low.

8. The shift register according to claim 4, wherein the switch transistors are N-type transistors.

9. The shift register according to claim 4, wherein the first potential is high and the reset signal is low.

10. A gate driving circuit, including the shift register in claim 1.

11. An array substrate, including the gate driving circuit that incorporates a shift register in claim 1.

12. A display apparatus, including the array substrate with a gate driving circuit that incorporates a shift register in claim 1.

13. A shift register, comprising:

a plurality of shift register units;

a detecting circuit; and a reset circuit, wherein:

the detecting circuit is connected to at least two of the plurality of shift register units to detect output potentials of the two shift register units and to send a detection result to the reset circuit and the reset circuit is connected to at least one of the two shift register units such that, upon detection of output potential of each of the at least two shift register units connected to the detecting circuit over a predetermined value, the reset circuit resets output potentials of at least one of the two of shift register units connected to the reset circuit based on a detection result, wherein the detecting unit is connected to two of the shift register units.

14. A shift register, comprising:

a plurality of shift register units;

a detecting circuit; and a reset circuit, wherein:

the detecting circuit is connected to at least two of the plurality of shift register units to detect output potentials of the two shift register units and to send a detection result to the reset circuit and the reset circuit is connected to at least one of the two shift register units such that, upon detection of output potential of each of the at least two shift register units connected to the detecting circuit over a predetermined value, the reset circuit resets output potentials of at least one of the two of shift register units connected to the reset circuit based on a detection result, wherein:

one of the two shift register units is a first shift register unit of the plurality of shift register units; and the other of the two of the shift register units is a last shift register unit of the plurality of shift register units.

* * * * *